United States Patent [19]
Beriot

[11] 3,932,845
[45] Jan. 13, 1976

[54] SPECIALIZED DIGITAL COMPUTER WITH DIVIDED MEMORY AND ARITHMETIC UNITS

[75] Inventor: Alain Beriot, Paris, France
[73] Assignee: Thomson-CSF, Paris, France
[22] Filed: Jan. 22, 1974
[21] Appl. No.: 435,593

[30] Foreign Application Priority Data
Jan. 26, 1973 France .................. 73.02836

[52] U.S. Cl. .................. 340/172.5; 235/156
[51] Int. Cl.² .................. G06F 7/38; G06F 13/06
[58] Field of Search ......... 340/172.5; 235/156, 159, 235/160, 164

[56] References Cited
UNITED STATES PATENTS

| | | |
|---|---|---|
| 3,348,210 | 10/1967 | Ochsner .................. 340/172.5 |
| 3,594,732 | 7/1971 | Mendelson .................. 340/172.5 |
| 3,697,734 | 10/1972 | Booth et al. .................. 235/164 |
| 3,760,171 | 9/1973 | Wang et al. .................. 235/156 |

*Primary Examiner*—David H. Malzahn
*Attorney, Agent, or Firm*—Karl F. Ross; Herbert Dubno

[57] ABSTRACT

A specialized digital computer, adapted to carry out a specific and delimited range of functions with respect to its application, comprises separate and functionally different stores including: a program store, an input-output buffer store, a permanent-data store and a working store. The computer further comprises a long-operation arithmetic unit and a short-operation arithmetic unit which may operate simultaneously. It may also comprise circuits intended for making program branches by indirect addressing and also self-checking circuits of high efficiency.

7 Claims, 3 Drawing Figures

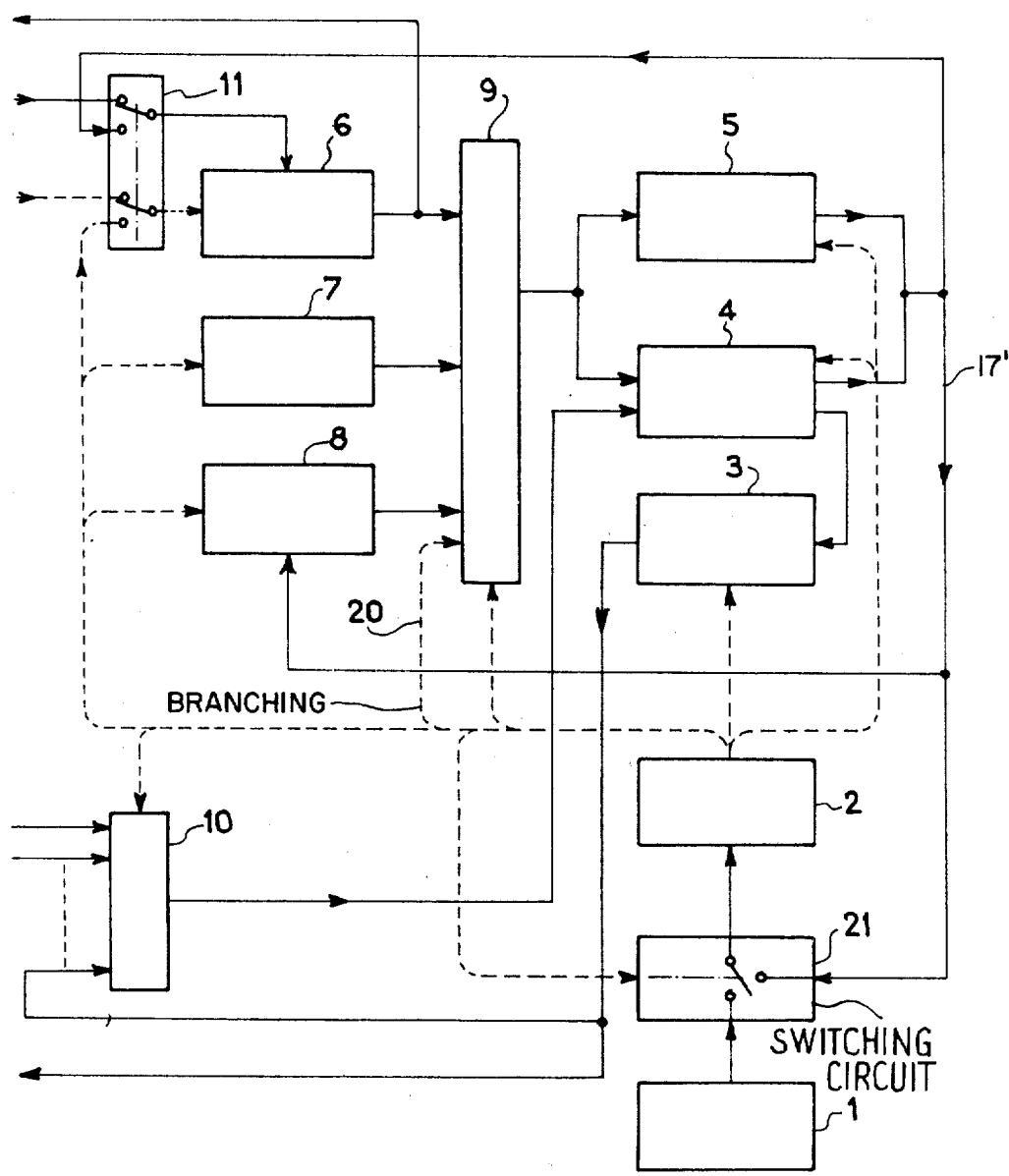

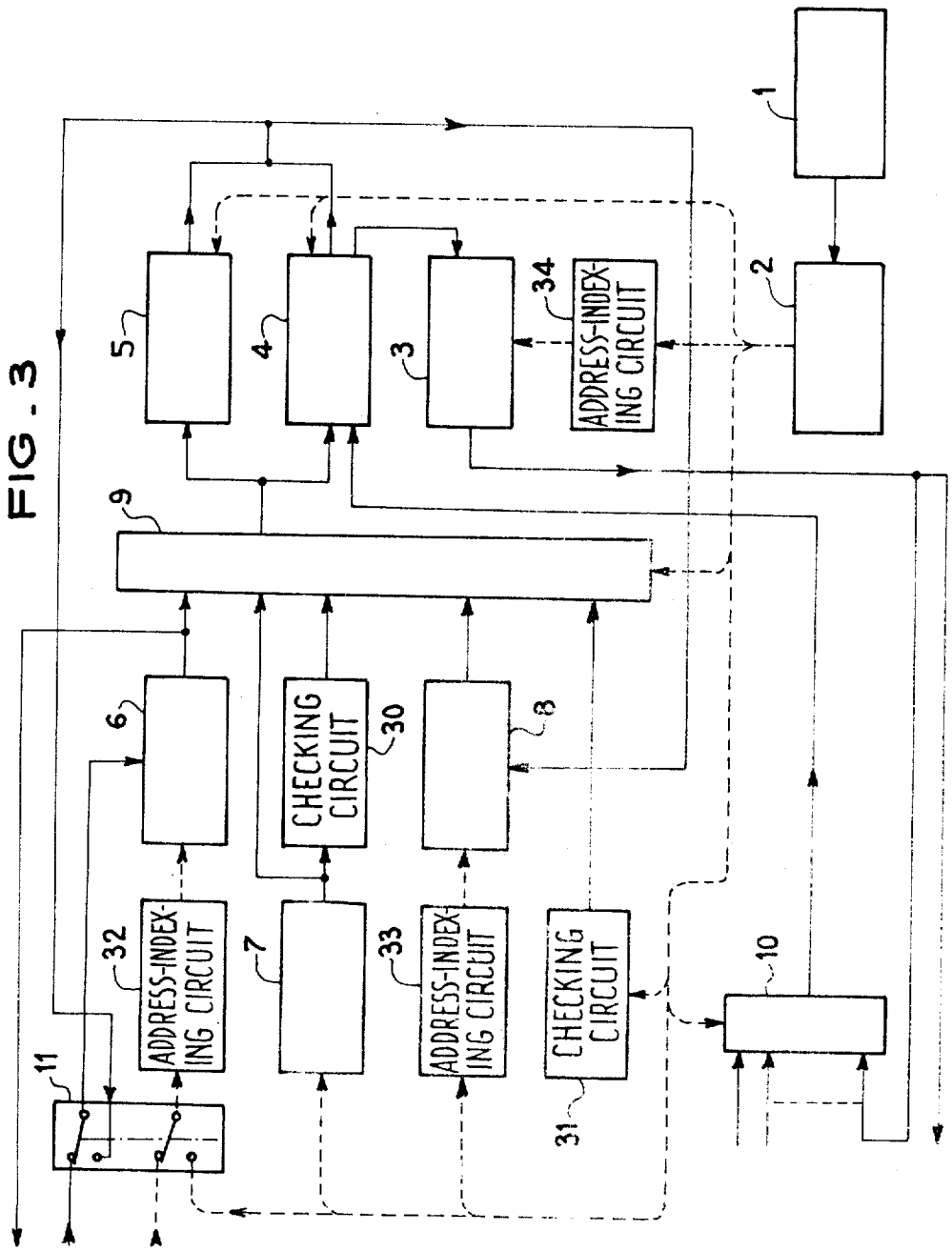

SPECIALIZED DIGITAL COMPUTER WITH DIVIDED MEMORY AND ARITHMETIC UNITS

FIELD OF THE INVENTION

The present invention relates to a specialized digital computer.

BACKGROUND OF THE INVENTION

Generally speaking a computer is a general-purpose machine in view of its ability to process information in accordance with a designed processing program. Thus, there is no problem in instructing the machine to adopt the procedure for the specific task which it is desired to entrust to it at any given moment, and it is equally easy to instruct it immediately afterwards to switch to a new procedure so that it can carry out a new task which may be radically different from the preceding one. Admittedly, the second assertion must be qualified in that, because a program or operating procedure has to be fed in, the machine is only able to undertake rigidly predetermined processing operations from which there is no room for departure. However, even with this limitation, the range of functions open to computers is still enormous and extends to practically all economic, industrial, technical, political and social activities.

In particular applications, for example in the case of an airborne navigation system, the functions required of them are fairly well delimited and defined, and it is therefore sufficient to have a specialized numerical calculator, that is to say one with a more restricted performance and one which consequently is of average or low versatility. The versatility of a computer depends on various factors and in particular on the speed of processing, on the capacity of its storage means, on the maximum possible number of simultaneous instructions and on the computer code selected; it enables equipment of this type to be defined from the performance point of view.

Thus, digital computers are designed to be able to carry out a wide diversity of tasks. To this end, it is necessary to reduce each of the tasks to a series of elementary basic operations. These basic operations are described by programs which, depending on the way in which the machine is designed, may be recorded either in the general store (which is the case with sub-programs) or in a back-up store (which is the case with micro-programming). In the first case the general store must carry out all the basic instructions. In the second case the general store is used only to carry out more general instructions, with the micro-programming store looking after elementary operations.

The advantages of such a technique are numerous; thus if the versatility of the computer can be increased by altering the configuration of the micro-programming back-up store, the operating speed is increased and it is possible to work with multi-processors, and so on.

These advantages are mainly the result of the fact that the store, which in a conventional computer contains the programs, the sub-programs, the data, the results, and the information required to monitor and supervise the machine, has been divided into two parts, i.e. the micro-programming back-up store and the general store.

Nevertheless, it may be pointed out that, in order to produce a general-purpose computer, it is necessary to make the processing circuits as universal as possible, with the consequence that a very large number of instructions has to be stored. This means that such a computer contains a file memory for storing information, which is expensive. For simple applications, where the range of functions is limited, such equipment is generally too large, in particular with respect to the high capacity of its file memory.

Moreover, finding the failures of the computer is difficult to carry out in real time, inasmuch as checking all the digits in the memory devices calls for a special and relatively lengthy test.

OBJECT OF THE INVENTION

The object of my present invention is to overcome the afore-mentioned drawbacks with a specialized digital computer whose complexity depends on the type of application envisaged and on the range of intended functions and which, in addition, comprises self-checking circuits of high efficiency.

SUMMARY OF THE INVENTION

In accordance with this invention I provide, in a digital computer, memory means including a program store and additional storage means addressable by the program store for readout instructions to calculating means including a short-operation and a long-operation arithmetic unit, the readout occurring through interposed multiplexing means under the control of the program store. The latter is triggered by clock means, connected to a timing input thereof, for activating the aforementioned memory, multiplexing and calculating means in a correlated manner.

According to a more particular feature of my invention, the operation of the several stores of the memory means may be tested by a systematic readout of the contents thereof to the calculating means by way of the aforementioned multiplexing means.

BRIEF DESCRIPTION OF THE DRAWING

The invention will now be further described with reference to the accompanying drawing in which:

FIG. 2 is a diagram of the computer of FIG. 1 arranged to allow program branching and indirect addressing; and FIG. 3 is a diagram of the computer of FIG. 1, provided with self-checking circuits enabling machine failures to be detected.

SPECIFIC DESCRIPTION

Figure 1:
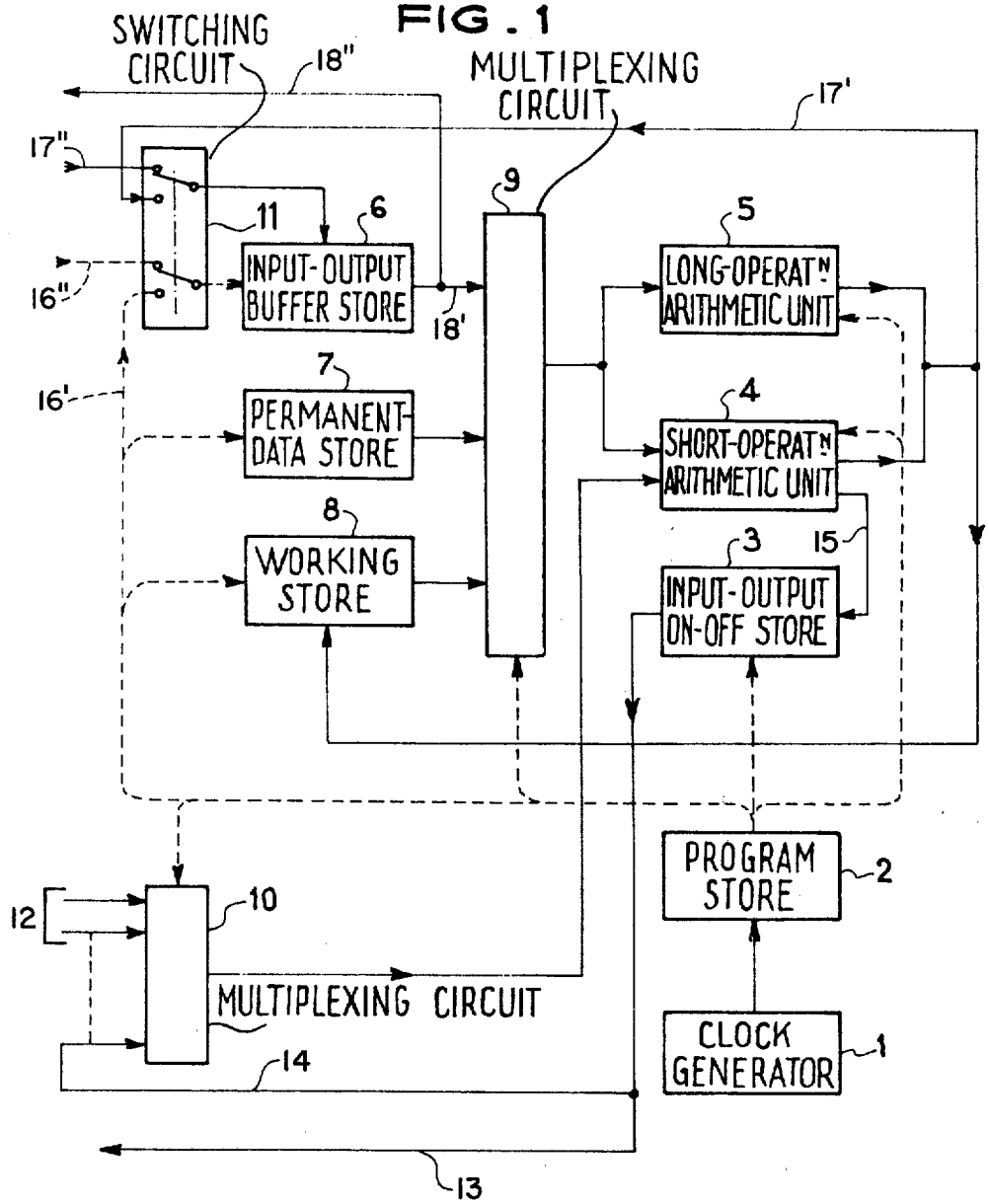
FIG. 1 is a diagram of an embodiment of a specialized digital computer according to the invention.

A specialized digital computer according to my invention includes storage means subdivided into several separate storage units having different functions. The storage units may for example consist of the following circuits:

a program store,
a permanent-data store,
a buffer store for input and output data,
a working store, and
an on-off store for input and output of binary information also called discrete signals.

This combination of storage units enables the separation of relatively complex operations, which take a long time, from relatively simple operations which can be carried out in a short time.

These two types of operation are performed by separate arithmetic units which operate simultaneously.

These units, which are also known as "operators" or as "computing units," either are micro-programmed or have logic-wired circuits, thus being able to carry out relativley complex tasks without outside assistance.

Since the time required to carry out the operations is different, it is possible to interfit the times at which these two types of operators have access to the various storage circuits.

The simultaneous execution of a plurality of operations enables either the overall processing speed to be increased or, if the processing speed remains the same, the structure of the operators themselves to be simplified for certain applications, for example by adopting series/parallel processing, or even series processing, in place of parallel processing.

Finally, the breakdown of the storage means into functional units enables the size of these units to be precisely matched to the application concerned and also enables any possible machine failures to be easily detected by means of suitable self-checking circuits.

In fact, the storage units for the program and the permanent data, which contain invariant values may be checked while the program is being carried out.

As regards the input-output buffer store and the working store, these are generally small in size and may be tested either by feeding control words to all the possible successive locations or by creating a specific, fairly brief, testing sequence.

The following description applies to a computer designed to be fitted into a self-contained complex system which requires a digital processing facility. This situation is frequently encountered in avionics where the pieces of equipment making up a complete airborne system are highly specialized from the functional point of view. (For example, the navigation system, or the central aerodynamic system, the automatic pilot.) In this type of application, the digital computer needs to be a sub-assembly fitted into the piece of equipment from which it receives input data and signals which convey functional binary instructions (discrete signals), and to which it feeds the results of its computation in suitable form. Generally speaking, the demands for calculations made by equipment having closely defined functions are rather modest, but call for highly varied types of numerical processing.

FIG. 1 shows a functional diagram of a specialized digital computer in accordance with the invention.

A clock generator 1, or time-base circuit, enables the logic operations carried out in the various sub-assemblies to be sequenced, and the equipment to be synchronized.

The memory units of the computer are formed by separate storage circuits 2, 3, 6, 7 and 8. The operators comprise two arithmetic units 4 and 5.

The two operators 4 and 5 are designed for short and long operations respectively. They carry out the tasks defined by instructions coming from a program store 2 and receive data coming to them via a multiplexing circuit 9 at times determined by the clock generator 1. The time required to carry out the operations is different for each of the operators and consequently the data and the results are processed at different times in the respective cases.

An input-and-output buffer store 6 is a high-speed memory which may be formed, for example, from semiconductors and whose addresses may be scanned twice by each of the elementary time units of the clock signal (this period being that required to process, one digit).

In this way, data coming from outside may be inscribed in this store at a predetermined address and, during the same basic unit of time, another value may be read from a different address given by the program store 2 and may be directed via the multiplexing circuit 9 to the arithmetic units 4 and 5. The same applies to the results of calculation, which may be entered in this store 6 while awaiting a request for their outward transmission. The address at which the calculated result is written into the input-output store 6 is supplied by the program store 2 and outward transmission takes place when the appropriate address and the read-out request are supplied by members external to the computer. Switching to the outside is accomplished by a double-pole two-position switching device 11 which is controlled by the clock generator 1.

A permanent-data store 7 is a lower-speed memory than the input-output buffer store 6 since it is only actuated at the clock frequency; store 7 may be of the "Read-Only Memory" type composed of semiconductors, cores or the like. This store 7 is addressed by the program store 2 and the data which it contains are fed to the arithmetic units 4 and 5 via the multiplexing circuit 9.

A working store 8 is addressed for read-out and read-in under the control of the program store 2. The performance of this store 8 may be substantially the same as that of the permanent-data store 7 and consequently may be carried out according to the same techniques.

The multiplexing circuit 9, formed by controllable switches, enables the store of interest at any given time (6, 7 or 8) to be selected under the control of the program store 2. The program store 2 may be similar in design to the permanent-data store 7 and is examined under the control of the clock generator 1. The information stored in it comprises the data and result addresses and the instruction codes which define the types of operation to be performed by the arithmetic units 4 and 5. In the case of simple applications, the program progresses according to an unbroken sequence regulated by the clock generator, as in the computer shown in FIG. 1. More complex applications require branching instructions to produce program jumps at specific addresses, i.e., nonsequential indirect addressing, and this makes it necessary to carry out predetermined operations on the instructions themselves.

The functional diagram of FIG. 2 shows a modification of the structure of FIG. 1 to allow the emission of program-branching instructions. These modifications consist in adding a selecting channel 20 to the multiplexing circuit 9 so that the instructions may be processed in the arithmetic units, and in providing the program store 2 with an alternate input enabling it to be addressed not only directly by the clock generator 1 but also by the outputs of the arithmetic units, via a controlled changeover switch 21 having contacts connected to internal data-input channel 17.

An input-output on-off store 3 and an ancillary multiplexing circuit 10 are associated with the short-operation arithmetic unit 4. The short operations include tasks of a logical nature, such as comparisons and conditional operations, based either on external logical conditions or on previous results. In all cases, a binary information or "discrete signal" is provided and formed by a single digit and not by a word as in the case of the data. The store 3 and the multiplexing circuit 10 are controlled by the program store 2. The multiplexing circuit 10 enables the discrete input signals coming from outside, over input connection 12, to be selected and the store 3 is used to retain the results of previous logical operations. The appropriate logic states are maintained during the whole of the time required to carry out the operation and consequently the access time of the store 3 may be longer than that of the other storage circuits 2, 6, 7 and 8. It may consist either of cores or of "MOS" semiconductors.

As shown in the drawing, store 3 has an output connection 13 with a feedback branch 14 leading to the ancillary multiplexer 10 alongside the outside input connections 12 thereof. Thus, arithmetic unit 4 can be selectively loaded with external instructions and with the contents of store 3, the latter being connected to unit 4 via a transfer connection 15.

Buffer store 6 is alternately addressable, under the control of switchover means 11, from program store 2 via an internal address channel 16' or from the outside via an external address channel 16'', being loaded at the same time with the contents of calculating means 4, 5 by way of an internal data-input channel 17' or with outside information by way of an external data-input channel 17''. An internal data-output channel 18' of store 6 terminates at multiplexer 9, an external data-output channel 18'' leading outwardly. Channel 17' also extends to working store 8.

The computer operates as follows: the clock generator 1 controls the successive codes to be read out from the program store 2. These codes may be either instructions defining the operations to be carried out by the arithmetic units 4 and 5, addresses for stores 3, 6, 7 and 8, or control data for multiplexing circuits 9 and 10. Each program advance corresponds to a specific operation on the values in store, which may be either a read-out or a read-in operation.

By way of example, a succession of instructions may correspond to the following sequence:

"Read-out of a value A from permanent-data store 7 and writing thereof in the long-operation arithmetic unit 5, read-out of a value B from input-output buffer store 6 and writing thereof in the long-operation arithmetic unit 5, read-out of the operation code for the long-operation to be carried out, read-out of a value C from working store 8 and writing thereof in the short-operation arithmetic unit 4, read-out of the operation code for the short-operation to be carried out, storage of the result D coming from the short-operation arithmetic unit 4 in working store 8 at address X, storage of the result F coming from the long-operation unit in input-output buffer store 6 at address Y."

It is normally possible to fit in several short operations during the period taken by one long operation.

A particular code indicates that the cycle has been completed, i.e., indicates the length of the program which is under way, and orders a return to the beginning of the program or a changeover to be made to a following program depending on the application and the instructions which have been recorded (program renewal or program change).

The way in which the arithmetic units 4 and 5 operate may easily be appreciated if they are assumed to be of conventional form, namely that of arithmetical units with micro-programmed logic circuits. On the basis of the data which they receive and the operation codes transmitted by the program store 2, they carry out the prescribed operations independently and feed out their results at specific times determined by the clock generator 1 so that the results may be stored at the addresses given by the program store 2 in the appropriate storage circuits.

As mentioned above, this combination also allows the computer to be continuously and very effectively monitored with the aid of simple means and enables possible failures to be rapidly detected.

FIG. 3 shows the modifications required to allow this self-checking. They comprise checking circuits 30 and 31 for the program store 2 and the permanent-data store 7, these being of the "read-only" type, and address-indexing circuits 32, 33 and 34 for stores 3, 6 and 8, these being of the "read-in and read-out" type. In the first case, since the contents of the stores do not change, the check may consist, for example, of a test of the "parity check" type, the complexity of which depends on a predetermined monitoring rate. The test may consist for example in counting the bits 1. In the second case, indexing the addresses each time a program cycle is carried out enables one or more test words to be shifted in the appropriate stores. In both cases the results (parity condition, and the integrity of the test words) are checked by the arithmetical units 4 and 5. The latter are themselves checked by carrying out a testing sub-program each time a program cycle takes place, this sub-program causing all the possible calculating operations to be performed.

The address-indexing circuits and self-checking circuits may be constructed according to known techniques.

In order not to overload the Figures, the multi-wire connections between the various block circuits are each drawn as a single line and those running from the clock generator 1 to the various block circuits are not drawn, except that by which it addresses the program store 2.

A specialized digital computer as described is suitable for applications where a small or moderate amount of digital and logical processing is required, this being the case particularly with ground or airborne equipment in the following areas: navigation, display, automation and military systems.

In the flight-navigation application, the store capacity, in comparison with that of a conventional digital computer, may be reduced at least by 40%. Also to be borne in mind is the simplification of the circuits and the increased efficiency of the self-checking means.

Of course the invention is not limited to the embodiment described and shown which has been given solely by way of example.

What is claimed is:

1. A digital computer comprising:
memory means including a program store and additional storage means, said program store being provided with a timing input;
calculating means including a short-operation arithmetic unit and a long-operation arithmetic unit, said additional storage means being addressable by said program store for reading out instructions for said calculating means;
multiplexing means inserted between said additional storage means and said calculating means for selectively directing said instructions to said short-operation and long-operation arithmetic units under the control of said program store; and clock means connected to said timing input for triggering said program store into correlated activation of said memory, multiplexing and calculating means.

2. A computer as defined in claim 1 wherein said additional storage means includes an on-off store with an output connection and with a transfer connection for data read out only from said short-operation arithmetic unit, said multiplexing means including an ancillary multiplexer with outside input connections and with a feedback branch from said output connection for selectively loading said short-operation arithmetic unit with external instructions and with the contents of said on-off store.

3. A computer as defined in claim 2 wherein said additional storage means further includes a buffer store with internal and external data-input channels, internal and external address channels, and internal and external data-output channels, said internal data-input channel originating at said calculating means, said internal address channel originating at said program store, said internal data-output channel terminating at said multiplexing means, further comprising switchover means for alternately connecting said internal and said external data-input and address channels to said buffer store.

4. A computer as defined in claim 3 wherein said program store is provided with a selection channel for carrying branching instructions via said multiplexing means to said calculating means, further comprising changeover means for switching said timing input from said clock means to said internal data-input channel during emission of said branching instructions.

5. A computer as defined in claim 3 wherein said additional storage means further includes a read-only store for permanent data and a working store loadable from said internal data-input channel.

6. A computer as defined in claim 5, further comprising test means for systematically reading out the contents of said memory means to said calculating means for checking the performance of said stores.

7. A computer as defined in claim 6 wherein said test means comprises checking circuits connected to receive the contents of said program store and said read-only store for transmission to said calculating means via said multiplexing means, and address-indexing circuits connected to address inputs of said buffer, working and on-off stores.

* * * * *